United States Patent [19]

Giesecke et al.

[11] Patent Number: 4,910,045

[45] Date of Patent: Mar. 20, 1990

[54] PROCESS FOR IMPROVING THE ADHESIVE STRENGTH OF ELECTROLESSLY DEPOSITED METAL LAYERS ON POLYIMIDE SURFACES

[75] Inventors: Henning Giesecke, Cologne; Gerhard D. Wolf, Dormagen; Wilfried Zecher, Leverkusen, all of Fed. Rep. of Germany

[73] Assignee: Bayer Aktiengesellschaft, Leverkusen, Fed. Rep. of Germany

[21] Appl. No.: 278,874

[22] Filed: Dec. 2, 1988

[30] Foreign Application Priority Data

Dec. 23, 1987 [DE] Fed. Rep. of Germany ....... 3743780

[51] Int. Cl.$^4$ .............................................. B05D 5/12
[52] U.S. Cl. ................... 427/98; 427/385.5; 427/304; 427/305; 427/306
[58] Field of Search ............... 427/96, 385.5, 304, 427/305, 306

[56] References Cited

U.S. PATENT DOCUMENTS

| 4,368,281 | 1/1983 | Brummett | 427/98 |
|---|---|---|---|
| 4,387,192 | 6/1983 | Yonezawa | 525/426 |
| 4,493,861 | 1/1985 | Sirinyan | 427/305 |
| 4,505,980 | 3/1985 | Nishizawa | 427/118 |
| 4,546,162 | 10/1985 | Zecher | 528/67 |
| 4,549,006 | 10/1985 | Zecher | 528/73 |
| 4,628,079 | 12/1986 | Zecher | 528/73 |

OTHER PUBLICATIONS

R. Cannizzaro "Applications of Polyimide Materials in Electronic Circuitry" Solid State Technology, Nov. 1969, pp. 31–38.
Julius Grant "Hackh's Chemical Dictionary" McGraw-Hill Book Company, p. 527.

*Primary Examiner*—Shrive Beck
*Assistant Examiner*—Vi Duong Dang
*Attorney, Agent, or Firm*—Sprung Horn Kramer & Woods

[57] ABSTRACT

To improve the adhesive strength of electrolessly deposited metal deposits on surfaces of polyimide moulded bodies, the latter are treated with an activator formulation which, in addition to solvents, fillers and organometallic activators, preferably contains 5–25% of a polyimide as binder.

8 Claims, No Drawings

PROCESS FOR IMPROVING THE ADHESIVE STRENGTH OF ELECTROLESSLY DEPOSITED METAL LAYERS ON POLYIMIDE SURFACES

It is generally known that, for the purpose of achieving an adhesive metal deposit on electrically nonconducting carrier bodies, an adhesion-promoting lacquer based on, preferably, ABS polymers is applied to the surface. The disadvantage of this method of pretreatment is, however, that the moulded body coated with this layer of lacquer has to be treated with a pickle before the actual metallization for the purpose of roughening the surface (cf., for example, DE-A-1,958,839).

It has therefore already been proposed to treat non-metallic substrate surfaces directly with activator solutions for the electroless metallization which contain complicated mixtures of acrylonitrile/butadiene copolymers and, optionally, phenolic resins, without previous pickling (cf., for example, U.S. patent specifications Nos. 3,305,460 and 3,560,257).

Such a process has, however, been unable hitherto to be successful in industry since the adhesive strength of the metal layers produced is inadequate and the adhesion-promoting polymers do not fulfill the high requirements imposed on the thermal and electrical properties, in particular in conductor board technology.

Although the process according to U.S. Pat. No. 4,368,281 does, on the other hand, provide better adhesive strength, relatively large amounts of activator, namely 5 to 16% by weight, are necessary for this purpose.

It has now been found that well adhering metal layers can be applied to polyimide surfaces without the said disadvantages if the latter are treated with printing paste formulations which contain, as essential constituents, (a) 0.03–4.00% by weight of an organometallic noble-metal compound as activator,
(b) 3–40% by weight of a polyimide,
(c) 1–30% by weight of a filler and
(d) 45–90% by weight of a solvent.

It is surprising that the formulations according to the invention bring about an adhesive metallization even in very thin layers (around 1 $\mu$m), for it is known from the conductor board industry that adhesive layers of around 25 $\mu$m are necessary for an adhesive bonding polyimide sheeting to copper.

Preferred printing pastes contain 0.05 to 3% of component (a), 5 to 25% each of components (b) and (c) and 60 to 80% of component (d).

Within the scope of this invention, "polyimides" are understood to mean aliphatic, aliphatic-aromatic and aromatic polyimides and variants thereof, such as polyamideimides, polyetherimides and polyesterimides, and also cocondensates and mixtures thereof. The preparation is carried out, for example, by condensation of cyclic polycarboxylic acid anhydrides, polycarboxylic acid carboxylic acid anhydrides, polycarboxylic acids or esters thereof with polyamines, polyamides, polyisocyanates or polycarbamic acid esters. The binders according to the invention may be employed as polymers or as oligomeric imides or polyamide acids which are then fully condensed after the application (for example, D. I. De Renzo, Wire Coatings, Noyes Dato Corporation 1971, pages 89–119, "Polyimides"—K. L. Mittal, Plenum Press 1984).

Preferably, use is made of aliphatic-aromatic polyamideimides, such as are obtained by condensation of, for example, trimellitic anhydride with polyisocyanates and lactams or polyamides and are described in German Patent Specifications 1,770,202, 1,956,512 and 2,542,706, and also U.S. Pat. Nos. 4,549,006 and 4,628,079.

Polyamideimides, which are obtained from trimellitic anhydride, caprolactam and 4,4'-diisocyanatodiphenylmethane or from blends of 4,4'-diisocyanatodiphenylmethane and industrial mixtures of 2,4- and 2,6-toluylene diisocyanate according to German Patent Specification 1,770,202 and U.S. Pat. No. 4,546,162, have proved to be particularly suitable. The preparation may preferably be carried out in phenolic solvents, for example in industrial cresol mixtures, from which the polyamideimide is then precipitated, for example with methanol. A further embodiment is to concentrate the solution of the polyamideimide down to a solid content of approx. 75% by weight. A melt of the polyamideimide is obtained which solidifies to a brittle resin on cooling. The solvent constituents can be removed from the resin by extraction with, for example, methanol and polyamideimides according to the invention are obtained as a residue.

Suitable activators in the formulations according to the invention are organometallic compounds of the 1st or 8th subgroup of the periodic system (in particular, Pd, Pt, Au and Ag), such as are described, for example, in EP-A-34,485, 81,438, 131,195. Particularly suitable are organometallic compounds of palladium with olefins (dienes), with $\alpha,\beta$-unsaturated carbonyl compounds, with crown ethers and with nitriles. Very particularly suitable are butadienepalladium dichloride, bisacetonitrilepalladium dichloride, 4-cyclohexene-1,2-dicarboxylic acid anhydridepalladium dichloride, mesityl oxide-palladium dichloride, 3-hepten-2-onepalladium chloride, 5-methyl-3-hexen-2-onepalladium chloride.

Obviously, mixtures of these compounds may also be employed. They may be present in the formulations in solution or dispersion. At the same time, a solution may also be prepared by adding solubilizers, for example quaternary ammonium salts, such as tetrabutylammonium bromide. If the activators are dispersed, it must be ensured that particle sizes below 1 $\mu$m are reached.

Particularly suitable for the process according to the invention are formulations which contain, in addition to the activators and the binders essential to the invention, solvents, fillers and also, optionally, surfactants and other auxiliary agents.

Suitable solvents in the formulations according to the invention are substances known in the printing and lacquering technology, such as aromatic and aliphatic hydrocarbons, for example, toluene, xylene, benzine, petroleum ether; glycerol; ketones, for example, acetone, methyl ethyl ketone, cyclohexanone, methyl isobutyl ketone; esters, for example butylacetate, dioctyl phthalate, butyl glycolate; glycol ethers, for example ethylene glycol monomethyl ether, diglyme, propylene glycol monomethyl ether; esters of glycol ethers, for example ethyl glycol acetate, propylene glycol monomethyl ether acetate; diacetone alcohol. Obviously, mixtures of these solvents and their blends with other solvents may also be employed.

Particularly suitable for the process are, however, solvents which slightly dissolve or slightly swell polyimides or polyamideimides or their precursors. As examples, mention may be made of dimethylformamide, N-methylpyrrolidone, butyrolactone, N-methylcaprolactam, dimethylacetamide and hexamethylphosphoric triamide.

The new formulations according to the invention may be made up with these solvents or may contain these solvents mixed with diluting agents.

Suitable fillers are auxiliary substances known from the printing and lacquering technology, such as pigments, disperse silicates, clay minerals, soot and rheological additives.

As examples, mention may be made of:
aerosils, $TiO_2$, talcum, iron oxide, kieselguhr, heavy spars, kaolins, quartz powder, smectites, colour blacks, graphites, zinc sulphides, chromium yellow, bronzes, organic pigments and chalk. Preferred are aerosils, heavy spars and $TiO_2$. Obviously, mixtures of the fillers may also advantageously be employed.

In addition to the activators, fillers, binders and solvents, the formulations optionally contain surfactants, levelling agents and/or dyestuffs.

The preparation of the formulations according to the invention are carried out, in general, by mixing the components. For this purpose, in addition to simple stirrers, in particular, the wet comminution units which are standard in lacquering and printing technology, such as kneaders, attrition mills, cylinder mills, dissolvers, rotor-stator mills, ball mills and also stirred ball mills are particularly suitable. Obviously, the incorporation of the constituents of the formulation can also be carried out in separate steps. For example, the activator may first be dissolved or dispersed in binders and solvents and the fillers only then incorporated. Making the fillers into a paste in the solvents under high shear forces is a possible process variant.

Surfaces can be activated for the purpose of an adhesive chemogalvanic metallization by applying the formulations according to the invention. The application is carried out, in general, by processes known from lacquering and printing technology.

As examples, mention may be made of:
spraying on, brushing on, rolling on, offset printing, screen printing, tampon printing, gravure, immersion.

Suitable substrates for the process according to the invention are polyimide surfaces or polyimide-like surfaces. Polyimides are described, for example, in K. L. Mittal: "Polyimides", Plenum Press 1984, or D. J. De Renzo: "Wire Coatings", Noyes Dato Corporation, 1971, pages 89–119. Polyimide-like surfaces are understood to mean substrates which contain yet other functional groups, such as, for example, amide groups, ester groups, ether groups, sulphone groups or sulphate groups, in addition to polyimide groups.

After the application of the formulations according to the invention to the surface, the solvents are removed. In general, this is done by drying.

The drying can be carried out at various temperatures, for example, between RT and 350° C. and under normal pressure or also in vacuo. The drying time may, obviously, vary considerably.

The surfaces thus nucleated, then have to be activated by reduction. For this purpose, the reducing agents which are standard in electroplating technology, such as, for example, formaldehyde, hypophosphite and boranes, can preferably be used.

A particularly preferred embodiment in using the formulations according to the invention is to carry out the reduction in the metallization bath directly with the reducing agent of the electroless metallization. This version is suitable particularly for nickel baths containing amine boranes or copper baths containing formalin.

The surfaces activated with the formulations according to the invention can be metallized in a further process step. For this purpose, in particular, baths containing nickel, cobalt, iron, copper, silver, gold and palladium salts or mixtures thereof are suitable. Such metallization baths are known in the technology of electroless metallization.

The formulations according to the invention are suitable for an overall activation, particularly however for a partial activation of surfaces, very particularly for producing printed circuits, foil keyboards, switching mats and sensors by printing processes, in particular screen and tampon printing processes, and subsequent additive chemical metallization.

EXAMPLE 1

A 40% solution of an aromatic polyamideimide is prepared in N-methylpyrrolidone from 4,4-diphenylmethane diisocyanate and trimellitic anhydride.
250 parts by weight of a 40% solution of this aromatic polyamideimide,
90 parts by weight of propylene glycol methyl ether acetate,
2 parts by weight of 3-hepten-2-onepalladium chloride and
15 parts by weight of Aerosil ® ($200 \, m^2/g$ according to BET)
are carefully mixed or dispersed with each other in a bead mill.

The paste produced is printed through a screen onto a commercial polyimide film and the print is dried for 1 hour at 200° C. Then the print is reduced for 5 min in a 1% dimethylamine-borane solution and subsequently metallized for 40 minutes in a copper bath containing formalin. A cohesive metal layer is produced.

Adhesive strength according to DIN 53 151: characteristic value GT 1.

EXAMPLE 2

A 10% solution of a polyimide is prepared in butyrolactone from isopropylidenediphthalic anhydride and 2,2-bis(4-aminophenoxyphenyl)propane.
270 parts by weight of this 10% solution in butyrolactone and
130 parts by weight of glycol methyl ether acetate,
3.3 parts by weight of 5-methyl-3-hexen-2-onepalladium chloride,
30 parts by weight of barium sulphate and
10 parts by weight of Aerosil ® ($200 \, m^2/g$ according to BET)
are carefully mixed with each other using a 3 cylinder roller.

The paste produced is printed through a screen onto a polyimide film, the print is subsequently dried for 2 hours at 175° C. and metallized as described in Example 1.

EXAMPLE 3

A 40% hot solution of a polyamideimide is prepared in cresol from trimellitic anhydride, 4,4'-diphenylmethane diisocyanate and ε-caprolactam. The polymer is precipitated by pouring the solution into methanol, dried and finely ground.
260 parts by weight of a 20% solution of this polymer in N-methylcaprolactam and 130 parts by weight of methoxypropyl acetate,
2.2 parts by weight of butadienepalladium didichloride and
20 parts by weight of Aerosil ® (380 m²/g according to BET)
are carefully mixed or dispersed in a dissolver.

The paste produced is printed through a screen onto a commercial polyimide film and dried for 5 minutes at 300° C. Subsequently, the print is metallized for 1 hour in a copper bath containing formalin. A cohesive copper layer is obtained.

Adhesive strength according to DIN 53 494: 27 N.

EXAMPLE 4

A screen printing paste according to Example 3 is printed onto a metal sheet which was coated with a polyamideimide from trimellitic anhydride and 4,4-diphenylmethane diisocyanate. After drying (1 h, 250° C.), and copperplating the print in a copper bath containing formalin (1 h), a cohesive metal layer is obtained.

Adhesive strength according to DIN 53 151: characteristic value GT 1.

EXAMPLE 5

280 parts by weight of a 20% solution of a polyamideimide according to Example 3 in N-methylcaprolactam,
130 parts by weight of butyl glycolate,
3 parts by weight of bis(acetonitrile)palladium dichloride,
35 parts by weight of titanium dioxide and
0.1 parts by weight of a silicone oil
are mixed with each other or dispersed using a 3-cylinder roller.

The paste is printed onto a polyamideimide film and the print is dried for 2 hours at 200° C. After metallizing for 1 hour in a copper bath containing formalin, a cohesive metal layer is obtained.

Adhesive strength according to DIN 53 151: characteristic value GT 0.

Adhesive strength according to DIN 53 494: 26 N.

EXAMPLE 6

250 parts by weight of a 20% polyamideimide solution according to Example 3,
125 parts by weight of methoxypropyl acetate,
3 parts by weight of butadienepalladium chloride and
30 parts by weight of Aerosil ® (380 m²/g according to BET)
are mixed or dispersed in a dissolver.

The paste is printed onto a polyimide film (Kapton H 300) and the print is dried for 5 minutes at 350° C. After metallizing the print for one hour in a copper bath containing formalin, a cohesive metal layer is obtained.

Adhesive strength according to DIN 53 151: characteristic value GT 0.

Adhesive strength according to DIN 53 494: not measurable since the copper layer can no longer be separated from the film.

We claim:

1. A process for improving the adhesive strength of electrolessly deposited metal layers on polyimide surfaces comprising treating the same with an activator formulation containing a binder, without pickling, wherein the formulation comprises
   (a) 0.03–4.00% by weight of an organometallic noble-metal compound as an activator,
   (b) 3–40% by weight of a polyimide binder,
   (c) 1–30% by weight of a filler and
   (d) 45–90% by weight of a solvent.

2. A process according to claim 1, wherein said activator is an organometallic compound of the 1st or 8th subgroup.

3. A process according to claim 1, wherein said binder is an polyimide obtained by condensation of cyclic polycarboxylic acid anhydrides, polycarboxylic acid carboxylic acid anhydrides, polycarboxylic acids or polycarboxylic acid esters with polyamines, polyamides, polyisocyanates or polycarbamic acid esters.

4. A process according to claim 1, wherein said binder is an aliphatic-aromatic polyamideimide obtained by condensation of trimellitic anhydride with polyisocyanates and lactams or polyamides.

5. A printing paste formulation according to claim 1 useful for the production of printed circuits, foiled keyboards, switching mats and sensors.

6. A process according to claim 1, wherein the formulation comprises
   0.05 to 3 weight % of the organometallic noble metal compound,
   5 to 25 weight % of the polyimide
   5 to 25 weight % of the filler and
   60 to 80 weight % of the solvent.

7. A process according to claim 1, wherein the polyimide is a polyamideimide, a polyetherimide, a polyesterimide or a cocondensate or a mixture thereof.

8. A process according to claim 1, wherein the polyimide is a polyamideimide obtained from trimellitic anhydride, caprolactam and 4,4'-diisocyanatodiphenylmethane or from blends of 4,4'-diisocyanatodiphenylmethane and mixtures of 2,4- and 2,6-toluylene diisocyanate.

* * * * *